United States Patent [19]

Perdue

[11] 4,408,172
[45] Oct. 4, 1983

[54] VARIABLE SPEED TUNING SELECTOR
[75] Inventor: Terry A. Perdue, St. Joseph, Mich.
[73] Assignee: Heath Company, St. Joseph, Mich.
[21] Appl. No.: 309,666
[22] Filed: Oct. 8, 1981
[51] Int. Cl.³ .............................. H03J 1/14; H03J 1/22; H03J 3/02
[52] U.S. Cl. .......................................... 334/11; 334/5; 358/191.1; 455/169; 455/170
[58] Field of Search ............... 334/5, 11, 15; 307/308, 307/116; 328/1; 455/165, 169, 170, 177, 183; 358/191.1, 192.1, 193.1; 250/231 SE

[56] References Cited
U.S. PATENT DOCUMENTS 3,835,384  9/1974  Liff ................................... 455/183 X
4,207,479  6/1980  Yamamoto et al. .
4,263,581  4/1981  Okatani et al. ................. 455/170 X
4,263,618  4/1981  Wine .
4,267,601  5/1981  Umeda et al. ..................... 334/11 X
4,270,117  5/1981  Ziegelbein et al. ............. 455/183 X
4,281,415  7/1981  Rock, Jr. ........................ 455/183 X
4,352,010  2/1980  Koogler .......................... 455/170 X Primary Examiner—Paul L. Gensler

[57] ABSTRACT

A touch sensitive variable speed tuning selector is disclosed. A rotary tuning selector knob includes a finger contact coupled to touch sensitive circuitry. Tuning selector rotation causes a shaft encoder to provide a first pulsed output to tuning circuitry for normal frequency change increments. When the touch sensitive circuitry detects the presence of a finger on the contact, a signal is provided to the tuning circuitry causing each pulse from the shaft encoder to change frequency in larger increments for fast, or coarse, tuning. In a preferred embodiment, a change in the capacitance of a touch sensitive capacitive network changes the timing of input pulses provided to a flip-flop which, in turn, changes the flip-flop output to the variable speed tuning circuitry resulting in an increase in frequency change increments.

8 Claims, 2 Drawing Figures

VARIABLE SPEED TUNING SELECTOR

BACKGROUND OF THE INVENTION

This invention generally relates to frequency selectors for a variable frequency tuning system and more specifically is directed to a touch-sensitive selector system for variably controlling the tuning system's rate of change in frequency during the tuning process.

There are several approaches currently available for changing the frequency of the tuning system in a receiver or a transceiver. The traditional and most common method involves a knob or knobs mechanically coupled to one or more variable capacitors included in one or more oscillators which determine the frequency at which the unit receives and/or transmits. The frequency tuned to is displayed by means of a rotary or slide rule dial, or a digital display which is part of a frequency counter.

With the introduction of tuning systems incorporating frequency synthesizers which provide tuning in equal frequency increments, tuning is accomplished by means of a shaft encoder. The shaft encoder is coupled to the rotary selector, providing output pulses in response to the rotation of the selector knob. Frequency display is digital and is available without the use of a frequency counter. The output pulses of the shaft encoder are provided to one or more digital dividers for the incrementing or decrementing thereof, depending on which direction the knob is turned. For good frequency resolution small tuning increments are desirable, while an excessive number of revolutions of the selector knob should not be required in tuning between widely separated frequencies. Although both of these operating characteristics are highly desirable, they are frequently mutually exclusive. However, various approaches have been undertaken in attempting to make these two features compatible in the control selector of a tuning system.

One approach to improving tuning selector performance makes use of a separate knob to select one of the more significant digits, typically the 1 MHz digit, of the desired frequency. This may be accomplished by means of a rotary switch or another shaft encoder. Another approach employs a multi-speed knob with increasing selector knob rotation rates producing larger tuning frequency increments. A disadvantage of this method is that the user is frequently unaware of the rate of change of tuning frequency resulting in decreased tuning accuracy. This shortcoming may be avoided to some extent by the use of a pushbutton which, when pressed, increases tuning frequency increments.

Yet another approach makes use of two pushbutton switches to scan frequencies. One pushbutton is used for scanning up in frequency, while the other is used for scanning down, with frequency increment size either fixed or adjustable. Spinner selector knobs are frequently used in such tuning systems even where pushbutton switches are provided to expedite the tuning process. The spinner knob includes a finger hole near its circumference permitting it to be rapidly rotated when large frequency changes are desired. For fine tuning, the outside of the knob is rotated as desired.

The aforementioned approaches to variable speed tuning have not been the only efforts undertaken to improve the tuning process. The prior art also discloses efforts to facilitate tuning by means of touch control switches. This type of switch is responsive to a user touching a touch plate and changing the capacitance of a touch sensitive capacitive network. A sensing circuit detects the change in capacitance causing the controlled portion of the system to be appropriately regulated. This may, for example, be accomplished by detecting the change in amplitude of an alternating signal coupled through the touch sensitive capacitive network.

One approach to a touch sensitive switch is disclosed in U.S. Pat. No. 4,207,479 to Yamamoto et al. wherein is described a touch sensitive switch particularly adapted for use with Integrated Injection Logic ($I^2L$) circuitry. Included therein is a battery power source, a current limiter, an injector and first and second stage transistors supplied with current from the injector. A first touch electrode is coupled to the positive polarity of the battery power source while a second touch electrode is connected to an input terminal of an $I^2L$ circuit. The first stage switching transistor within the $I^2L$ circuit structure is normally OFF to minimize power consumption. When human body resistance is interposed between the touch electrodes, a high potential is impressed on the base of the first stage switching transistor which is thereby turned ON. With the injector thus energized current flows into the first stage switching transistor but not into the next stage switching transistor which is turned OFF. In this manner, ON and OFF switching signals are generated. Another approach to a touch control switch arrangement particularly adapted for use in a television receiver is disclosed in U.S. Pat. No. 4,263,618 to Wine. This switch arrangement includes a peak detector having a series connected diode and a shunt connected filter capacitor coupled beween a touch sensitive coupling network and the control portion of a system. An alternating signal is coupled through a capacitive coupling network with an amplitude dependent upon whether or not a user has touched the touch sensitive network. The alternating signal is peak detected by the peak detector to generate a DC control signal for the control portion. While offering various control switch advantages, the aforementioned touch control switch approaches are limited to specific tuning system environments and lack general applicability as a tuning system selector.

The present invention, however, may be used with any conventional tuning system for providing a variable tuning speed capability. It offers the advantages of ease of operation, low cost, and improved user control of receiver/transceiver tuning circuitry.

OBJECTS OF THE INVENTION

Accordingly, it is an object of the present invention to provide an improved selector for a tuning system in a receiver or a transceiver.

It is another object of the present invention to provide a tuning system selector for varying the rate of change in frequency of the tuning system for fine and coarse tuning capabilities.

Still another object of the present invention is to provide an improved touch-sensitive control system for a variable speed tuning system.

A still further object of the present invention is to provide a variable speed tuning system selector controlled by a single user-operated knob.

BRIEF DESCRIPTION OF THE DRAWINGS

The appended claims set forth those novel features believed characteristic of the invention. However, the invention itself as well as further objects and advantages thereof will best be understood by reference to the following detailed description of a preferred embodiment taken in conjunction with the accompanying drawings, where like reference characters identify like elements throughout the various figures, in which:

DESCRIPTION OF THE PREFERRED EMBODIMENT

Figure 1:
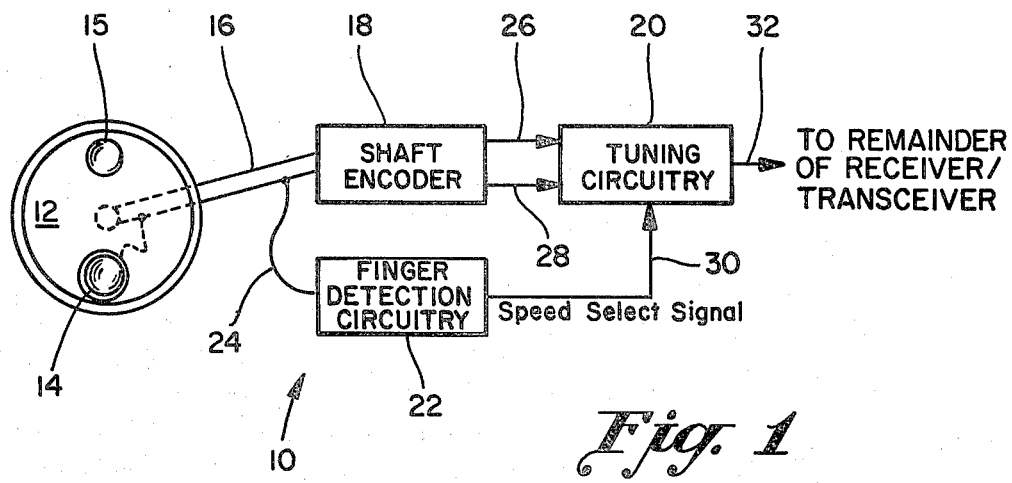
FIG. 1 is a simplified block diagram of a variable speed tuning selector system in accordance with the present invention.

Referring to FIG. 1, there is shown in block diagram form a variable speed tuning selector 10 in accordance with the present invention. A user-operated rotary knob 12 is mechanically coupled to selector shaft 16, the combination of which rotates in unison during user frequency selection. A shaft encoder 18 is coupled to and responsive to the rotation of selector shaft 16. The rotation of rotary knob 12 and selector shaft 16 causes shaft encoder 18 to develop square wave output signals in quadrature phase relation on output lines 26 and 28. The direction of rotation of selector shaft 16 defines which of the two square wave signals on lines 26 and 28 leads the other which, in turn, determines in which direction, up or down, tuning circuitry 20 will be directed to proceed in tuning to a new frequency.

Lines 26 and 28 are coupled to tuning circuitry 20 permitting the shaft encoder output signals to control the tuning direction of tuning circuitry 20 following a change in frequency by a user. The output of tuner 20 is a tuning signal provided via line 32 to the remaining components (not shown) of the receiver or transceiver.

When rotary knob 12 is turned by means of conductive finger contact 14 in changing the frequency of tuning circuitry 20, touch detector circuitry 22 receives an input signal in response thereto via line 24. In FIG. 1, line 24 is shown as being coupled to selector shaft 16, however, the touch sensing signal could be provided from finger contact 14 to touch detector circuitry 22 using any one of a variety of conventional signal coupling approaches. In response to user engagement of finger contact 14, touch detector 22 provides a speed select, or control, signal via line 30 to tuning circuitry 20. This speed select signal causes each pulse from shaft encoder 18 provided to tuning circuitry 20 to change the tuning frequency therein in larger increments. In this manner, the tuning rate of tuning circuitry 20 is changed in response to user engagement of finger contact 14 during a user-initiated frequency change in the receiver or transceiver. A non-conductive finger receptacle 15 is also included on the surface of rotary knob 12 which assists the user in turning knob 12 during high speed frequency, or station, changes. Non-conductive finger receptacle 15 and conductive finger receptacle 14 are preferably displaced 180° from each other on the periphery of the surface of rotary knob 12 and are in the form of cup-shaped inserts for improved finger positioning and knob control.

The technique of changing the tuning rate of a tuner in response to a control signal provided thereto is well known in the art and any one of a number of conventional control signal responsive, variable tuning rate approaches could be utilized in the present invention. In the preferred embodiment of the present invention, a microcomputer (not shown) is incorporated in a conventional manner in tuning circuitry 20. The microcomputer is responsive to the output pulses of shaft encoder 18 during frequency changes. The speed selector output signal of touch detection circuitry 22 is also provided to the microcomputer which, by means of its signal processing and logic organization, changes the tuning rate of tuning circuitry 20 in response thereto. The manner in which this aspect of the present system is implemented is conventional in nature and does not form a part of the present invention.

Figure 2:
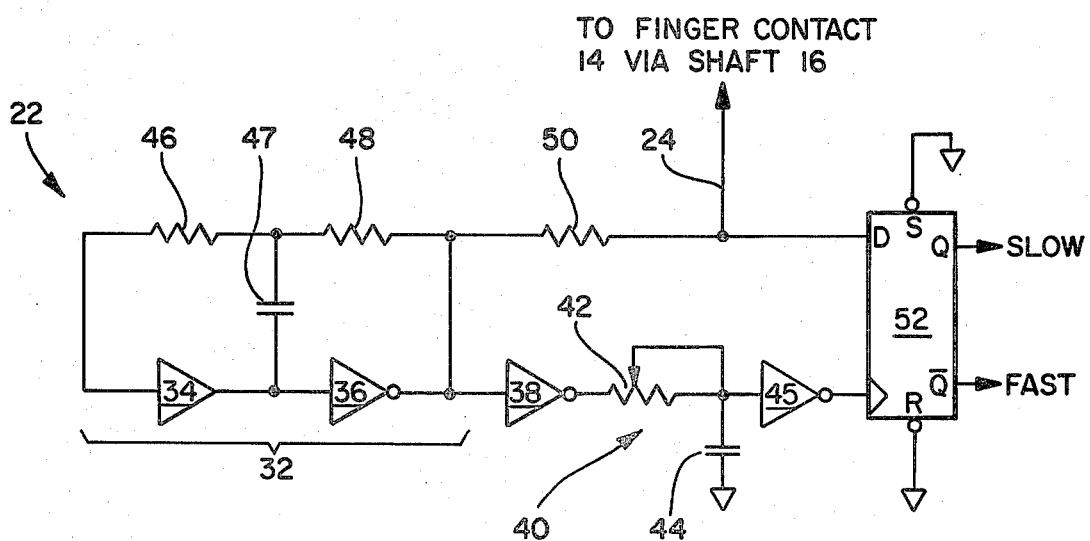
FIG. 2 shows partially in block diagram form and partially in schematic form a touch-sensitive detection circuit for controlling variable speed tuning circuitry in accordance with a preferred embodiment of the present invention.

Referring to FIG. 2, there is shown a touch detection circuit 22 in accordance with a preferred embodiment of the present invention. Touch detector circuit 22 includes a continuously-running square-wave oscillator 32 operating in the audio range. Oscillator 32 is comprised of buffer amplifier 34, inverter 36, capacitor 47 and resistors 46, 48. While oscillator 32 is described in terms of a specific combination of components, the present invention is compatible with any conventional source of timed signals. For example, a clocked output from a microprocessor could be utilized to establish system timing in the present invention. Inverter 36 provides an amplified and inverted output of buffer amplifier 34 to inverter 38 which again inverts and amplifies the output of oscillator 32. The output of inverter 38 is provided to integrator circuit 40 comprised of variable resistance 42 and ground-coupled capacitance 44. Inverter 38 in combination with variable resistance 42 and capacitance 44 provides for an adjustable delay of the output signal of oscillator 32 to the clock input (designated by means of a triangle) of flip-flop circuit 52. Inverter 45 is located between the junction of variable resistance 42 and grounded capacitance 44 and the clock input of flip-flop circuit 52 for "squaring up" the clock input provided thereto. The oscillator output signal is also provided by means of resistor 50 to the D-input of flip-flop 52. The variable delay provided by means of variable resistance 42 and capacitance 44 allows the threshold of flip-flop 52 to be set so that the signal on the D-input, or data input, goes high just in time to "set" flip-flop 52. When flip-flop 52 is set, an output signal is provided via its Q-output. A signal provided by the Q-output of flip-flop 52 represents the normal, or fine tune, tuning rate control signal provided to tuning circuitry 20.

Conductive finger contact 14 is also coupled to the D-input of flip-flop 52 via line 24. With finger contact 14 engaged by a user, the change in capacitance of the circuitry coupled to the D-input causes a delay in the arrival of the positive-going edge of the oscillator signal provided to the D-input. This results in the D-input appearing as a logic low when the clock signal provided to the clock input of flip-flop 52 goes high, thus "resetting" flip-flop 52. The resetting of flip-flop 52 produces an output signal on the $\overline{Q}$-output of the flip-flop. This $\overline{Q}$-output represents the fast, or coarse, tuning rate of tuning circuitry 20. The R-input and S-input of flip-flop 52 are coupled to circuit ground as is capacitor 44.

While the present invention has been described in terms of changing the tuning rate of tuner 20 in response to two different signals provided by the Q and $\overline{Q}$-outputs of a flip-flop circuit 52, it is not limited to this particular configuration. For example, only one output, either the Q or $\overline{Q}$-output signal, could be utilized for changing the tuning rate. The important point here is that a bi-stable signal source, in this case, a flip-flop circuit, responsive to changes in the capacitance of a capacitive coupled circuit providing an input thereto is used to provide a control signal to tuning circuit 20. The present invention would work equally well if only the Q or only the $\overline{Q}$-output from flip-flop 52 were provided to tuner 20 such that the control signal was initiated by either the "setting" or "resetting" of the flip-flop circuit.

There has thus been described a variable speed tuning selector featuring coarse and fine tuning modes of operation. The tuning selector is in the form of a single rotary dial in which is incorporated a touch-sensitive element which, when engaged, provides a control signal to tuning circuitry for varying the tuning rate thereof.

While particular embodiments of the present invention have been shown and described, it will be apparent to those skilled in the art that changes and modifications may be made therein without departing from the invention and its broader aspects. The aim in the appended claims, therefore, is to cover all such changes and modifications as fall within the true spirit and scope of the invention.

I claim:

1. A system for controlling the rate of change in frequency of a variable speed tuner in tuning to a selected frequency, said system comprising:
   user selectable rotary control means;
   detector means coupled to said tuner and to said rotary control means and responsive to the rotation thereof for providing a plurality of pulses to said tuner representing a first tuning rate; and
   touch sensitive means including conductive finger receptacle means integral with said rotary control means and coupled to said tuner for providing a control signal to said tuner when touched by a user for changing the tuning speed of said tuner to a second tuning rate in response thereto.

2. The system of claim 1 wherein said second tuning rate is greater than said first tuning rate with said touch sensitive means providing a coarse tuning mode of operation.

3. The system of claim 1 wherein said finger receptacle means in said rotary control means is coupled in circuit with a capacitive network wherein the capacitance of said capacitive network is changed when said receptacle means is engaged by the finger of a user.

4. The system of claim 3 wherein said detector means comprises a flip-flop circuit energized by the output signal of an oscillator and coupled to said capacitive network for providing said control signal to said tuner in response to changes in the capacitance of said capacitive network.

5. The system of claim 4 wherein the rise of said oscillator output signal sets said flip-flop with said flip-flop reset by means of a capacitively delayed oscillator output signal with said finger receptacle means engaged for providing said control signal to said tuner for changing the tuning speed thereof.

6. A system for controlling the rate of change in frequency of a variable speed tuner in tuning to a selected frequency, said system comprising:
   user selectable rotary control means;
   detector means coupled to said tuner and to said rotary control means and responsive to the rotation thereof for providing a plurality of pulses to said tuner representing a first tuning rate; and
   touch sensitive means integral with said rotary control means and coupled to said tuner for providing a control signal to said tuner when touched by a user for increasing the tuning speed of said tuner to a second tuning rate in response thereto for the coarse tuning of said tuner, said touch sensitive means including finger receptacle means coupled in circuit to a capacitive network wherein the capacitance of said capacitive network is changed when said finger receptacle means is engaged by the finger of a user.

7. In a variable speed manual tuning system for initially coarse tuning to a selected frequency at a high rate of change in frequency followed by fine tuning to said selected frequency at a lower rate of frequency change by means of a user selectable rotary control means, the improvement comprising:
   user selectable touch sensitive means including conductive finger receptacle means positioned in and integral with said rotary control means and coupled in circuit with said tuning system for providing a control signal thereto in response to selection of said touch sensitive means for changing the tuning speed to said high rate of frequency change in coarse tuning to a selected frequency.

8. A system for controlling the rate of change in frequency of a variable speed tuner in tuning to a selected frequency, said system comprising:
   user selectable rotary control means;
   detector means coupled to said tuner and to said rotary control means and responsive to the rotation thereof for providing a plurality of pulses to said tuner representing a first tuning rate, wherein said first tuning rate is determined by the speed of angular displacement of said rotary control means; and
   touch sensitive means integral with said rotary control means and coupled to said tuner for providing a control signal to said tuner when touched by a user for increasing the tuning speed of said tuner to a second tuning rate in response thereto, wherein said second tuning rate is a function of said first tuning rate.

* * * * *